United States Patent [19]

Liden

[11] Patent Number: 5,115,471
[45] Date of Patent: May 19, 1992

[54] HIGH FREQUENCY EXPANDER DEVICE

[75] Inventor: Gary Liden, Granada Hills, Calif.

[73] Assignee: Aphex Systems, Ltd., Sun Valley, Calif.

[21] Appl. No.: 636,761

[22] Filed: Jan. 2, 1991

[51] Int. Cl.⁵ .............................................. H03G 7/00
[52] U.S. Cl. ...................................... 381/106; 333/14
[58] Field of Search .......................... 381/106; 333/14

[56] References Cited

U.S. PATENT DOCUMENTS 4,661,851 4/1987 Muterspaugh ...................... 381/106
4,704,726 11/1987 Gibson .................................. 381/106

Primary Examiner—Forester W. Isen
Assistant Examiner—Nina Tong
Attorney, Agent, or Firm—Edward A. Sokolski

[57] ABSTRACT

An audio signal compression device which utilizes both a broad band compressor and a high frequency expander. The level of the compression provided by the compressor and the level of expansion provided by the high frequency expander are both controlled by a voltage or other signal that is output by signal level detection circuitry within the device. The broadband compressor provides a variable level of amplification (or attenuation) that is relatively uniform as a function of frequency. The high frequency expander provides a variable level of expansion wherein the high frequency components are expanded more than the mid and low frequency components.

16 Claims, 1 Drawing Sheet

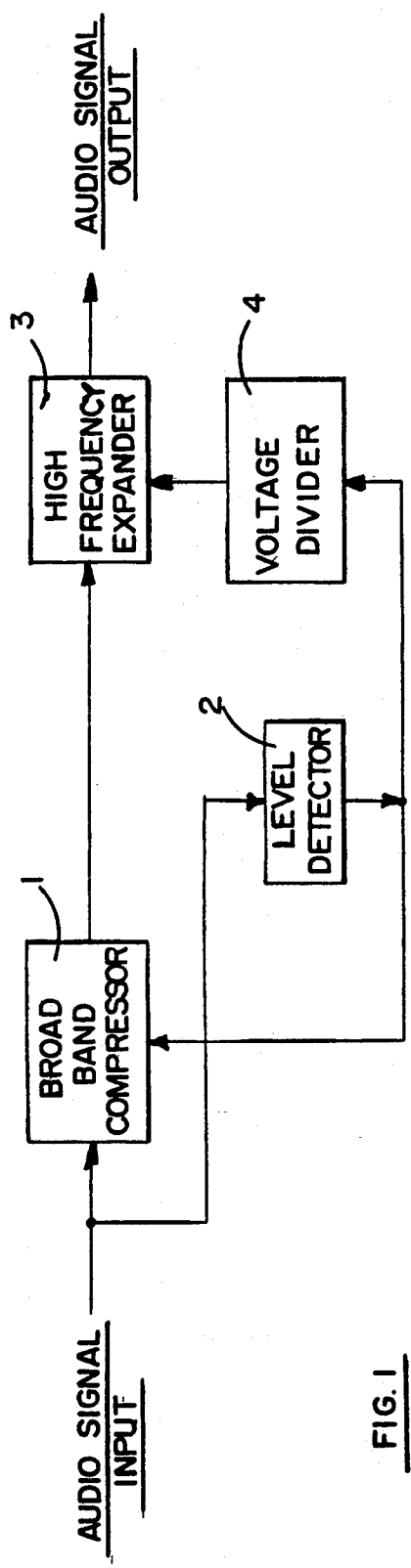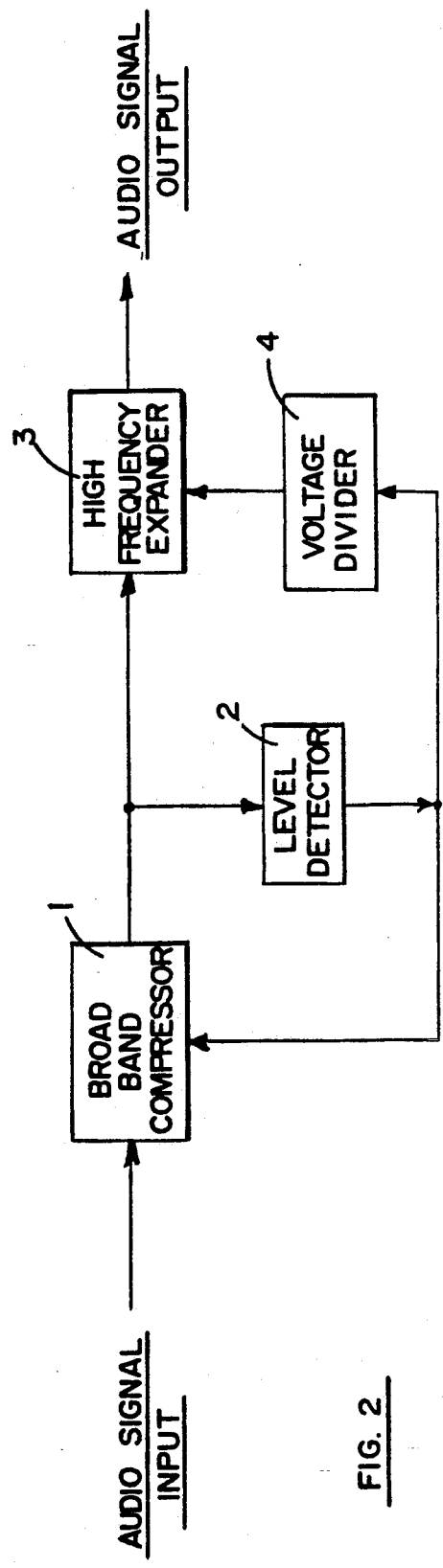

HIGH FREQUENCY EXPANDER DEVICE

BACKGROUND OF THE INVENTION

1. Field of the Invention

This invention pertains to audio systems. More particularly it pertains to devices used in such systems to compress the range of the amplitude of the audio signals so as to make relatively quiet musical passages louder or more audible while at the same time avoiding system overload during the louder passages.

2. Description of the Prior Art

A variable gain element has been used for compressing the dynamic range of musical signals in sound systems so as to make the quiet passages more audible while avoiding system overload during the louder passages of music. However, the human ear is more sensitive to changes in the loudness of an audio signal in the higher frequency range of audio signals, e.g. 400 hertz to 4 kilohertz, than at lower frequencies, e.g. near 100 hertz. That is, a 1 decibel "db" change in the level of an audio signal at 1 kilohertz is more apparent to the human listener than a 1 db change in the level of an audio signal at 100 hertz. Furthermore, because a larger amount of audio energy typically exists at the lower frequencies, the amount of compression is controlled by the lower frequency components. As a consequence, when the dynamic range of musical passages is heavily compressed in response to the energy in the entire spectrum of the signal, to the human listener the higher frequency components seem to be attenuated during loud passages.

In a typical dynamic range compression device, the audio signal passes through a variable gain element to a detector circuit. The detector circuit generates a control signal which, in turn, controls the gain of the variable gain element. The control signal from detector circuit is connected to the variable gain element so as to provide a lower gain at higher signal levels. As a consequence the dynamic range of the audio signal is compressed. As pointed out above, however, at the higher levels of compression, the high frequency components appear to have been compressed far more than the lower frequency components.

Various methods have been used in an attempt to mitigate this undesirable effect of compression on the higher audio frequencies. A frequency sensitive filter that reduces the sensitivity of the level detection circuit to the higher frequency components has been used but the result has been unsatisfactory because the lower frequency components typically predominate and control the level of compression. A fixed filter that attenuates the lower frequencies more than the higher frequencies passing through the system has also been used but gives unsatisfactory results because it fails to prevent system overload which is one of the purposes of the compression system. If the range of frequencies that have the most energy (i.e. the lower frequencies) do not control the level of compression, then the system is likely to be often overloaded with consequent distortion.

A compressor 2 that is composed of a combination of bandpass filters with an individual compressor for the output of each bandpass filters can be configured so as to compress the lower frequency components more than the high frequency components. However the result is quite different from that described in this invention because the in the multiple compressor device the compression of each band of frequencies is controlled by the energy in each such band of frequencies while in the present invention the initial compression is responsive to the energy in the entire range of audio frequencies.

A combination of a variable gain element operating to compress the dynamic range and a variable gain element operating to expand the dynamic range of the signal have been used in combination called "compansion" in recording systems to avoid overload of the recording device while at the same time retaining the dynamic range of the system. For instance, Haramoto et al, U.S. Pat. No. 4,072,914, discloses a compression and expansion system that is used to avoid overload of an intervening magnetic tape recorder The higher frequency signals are more apt to saturate magnetic tape recording system. Accordingly, in Haramoto, the entire range of input signals are attenuated when the input signal is loud and the high frequency components are attenuated even more than the lower frequency components. The signal that is output from the tape recording undergoes an inverse expansion in order to restore the original signal balance and dynamic range.

SUMMARY OF THE INVENTION

The present invention counteracts the apparent loss of the high frequency signals that otherwise occurs in broadband compression circuits by using a broadband, variable gain element that operates as a compressor followed by another variable gain element that operates as a dynamic range expander of the high frequency components of the audio signal. The compression by the broadband variable gain element and the expansion of the high frequency components by the high frequency variable gain element are both controlled by the same voltage generated by the broadband signal level detection circuitry. In some embodiments of the invention the amount of the control signal that is applied to the high frequency expander may be altered relative to the amount of the control voltage that is applied to the broad band compressor.

BRIEF DESCRIPTION OF THE DRAWINGS

FIG. 1 is a block diagram of an embodiment of the invention in which the input to the level detection circuitry is obtained from the audio signal that is input to the invention.

FIG. 2 is a functional block diagram of the invention in which the input to the level detection circuitry is obtained from the output of the broad band variable gain element that acts as a compressor.

DETAILED DESCRIPTION

Referring now to FIG. 1 which is a functional block diagram of an embodiment of the invention. The audio signal is input to broadband compressor 1, which is a broadband variable gain element whose level of amplification is controlled by the voltage or other signal output by level detector 2. The audio signal output from broad band compressor 1 is then input to high frequency expander 3 which is a variable gain element whose level of amplification is also controlled by the voltage or signal output from level detector 2. Some embodiments of the invention may also include a voltage divider 4 that may be used to alter the relative proportion of the control signal that is applied to compressor 1 and to high frequency expander 3. The relative amount of the control voltage applied to compressor 1 and to high frequency expander 3 may then be adjusted to obtain the most desirable apparent balance for the compression of the high and low frequency components of the audio signal. The level of amplification, of the high frequencies in high frequency expander 3 varies through a greater range than the level of amplification for the mid and lower frequencies in response to the voltage or signal output from level detector 2. It should be understood that although broadband compressor 1 and high frequency expander 3 are described as being variable gain elements having a variable level of amplification, either or both of these elements could be devices having a variable level of attenuation.

Broadband compressor 1, high frequency expander 3 and level detector 2 and voltage divider 4 operate in combination to produce an audio signal that is output from high frequency expander 3 and that has a smaller dynamic range than the range of the audio signal that is input to broadband compressor 1. However at high signal levels, the high frequency components in the output audio signal are not compressed as much as the mid and lower frequency components in the output signal.

Referring now to FIG. 2. The embodiment of the invention depicted in FIG. 2 utilizes the audio signal that is output from broad-band compressor 1 as the input to level detector 2. By using the output from compressor 1 as the input to level detector 2 this embodiment provides compression over a greater input signal dynamic range as compared to the circuit depicted in FIG. 1, because in the circuit of FIG. 2, the input to level detector 2 is compressed by its passage through compressor 1. It should also be understood that even though voltage divider 4 is depicted in the path from detector 2 to expander 3 it could instead be placed in the control signal path from detector 2 to compressor 1. It is intended that the magnitude of the control voltage applied to compressor 1 may be greater or less than that applied to expander 3.

In each of the embodiments depicted in FIGS. 1 and 2, the level of gain of compressor 1 and the gain of high frequency expander 3 are both controlled by the same voltage or signal that is output from level detector 2 although in those embodiments that include voltage divider 4, the size of the control voltage applied to compressor 1 need not be the same as that applied to expander 3.

I claim:

1. An audio signal compression system for outputting an output signal that is a compressed version of an input audio signal that is input to the system comprising:
   broadband compression means for compressing the input signal in response to a control signal,
   high frequency expansion means for expanding the high frequency components of the signal output from the broadband compression means in response to the control signal,
   control means for generating the control signal responsive to the input signal.

2. The device of claim 1 and further comprising means for altering the amount of the control signal that is applied to the broadband compression means relative to the amount of the control signal that is applied to the high frequency expansion means.

3. An audio signal compression system for outputting an output signal that is a compressed version of an input audio signal that is input to the system comprising:
   broadband compression means for compressing the input signal in response to a control signal,
   high frequency expansion means for expanding the high frequency components of the signal output from the broadband compression means in response to the control signal,
   control means for generating the control signal responsive to the input signal after compression by the broadband compression means.

4. The device of claim 3 and further comprising means for altering the amount of the control signal that is applied to the broadband compression means relative to the amount of the control signal that is applied to the high frequency expansion means.

5. An audio signal compression system for outputting an output audio signal that is a compressed version of an input audio signal that is input to the system comprising:
   broad band variable gain means for providing a variable level of amplification of the input audio signal over a broad band of audio frequencies and having an input and an output, the level of amplification of the broad band variable gain means changing in response to a control signal, the audio signal that is input to the system being input to the input of the broadband variable gain means,
   high frequency variable gain means for providing a variable level of amplification of high frequency audio signals relative to the amplification of lower frequency audio signals and having an input and an output, the level of amplification of the high frequency variable gain means changing in response to the control signal, the output of the broadband variable gain means being connected to the input of the high frequency variable gain means,
   audio level detection means for detecting the level of the audio signal in the audio signal compression system and generating the control signal responsive to the level of the audio signal in the signal compression system,
   the high frequency variable gain means outputting an audio signal representing the input audio signal after compression and frequency-selective expansion.

6. The device of claim 5 wherein the control signal generated by the audio level detection means is responsive to the audio signal input to the broadband variable gain means.

7. The device of claim 5 wherein the control signal generated by the audio level detection means is responsive to the audio signal at the output of the broadband variable gain means.

8. The device of claim 5 and further including means for altering the amount of the control signal that is applied to the broadband variable gain means relative to the amount of the control signal that is applied to the high frequency variable gain means.

9. The device of claim 6 and further including means for altering the amount of the control signal that is applied to the broadband variable gain means relative to the amount of the control signal that is applied to the high frequency variable gain means.

10. The device of claim 7 and further including means for altering the amount of the control signal that is applied to the broadband variable gain means relative to the amount of the control signal that is applied to the high frequency variable gain means.

11. An audio signal compression system for compressing an audio signal comprising:

a broadband variable gain element having an input and an output, the broadband variable gain element providing an audio signal at its output that is an amplification of the audio signal at its input, the level of amplification decreasing in response to a control voltage, a high frequency variable gain element having an input and an output, the high frequency variable gain element providing a variable level amplification of high frequency audio signals, relative to the amplification of lower frequency audio signals the level of amplification of the high frequency variable gain element increasing in response to the control signal, the output of the broadband variable gain element being connected to the input of the high frequency variable gain element, an audio level detection element that generates the control signal responsive to the level of the audio signal in the signal compression system.

12. The device of claim 11 wherein the control signal is responsive to the audio signal input to the broadband variable gain element.

13. The device of claim 11 wherein the control signal generated by the audio level detection element is responsive to the audio signal at the output of the broadband variable gain element.

14. The device of claim 11 and further including means for altering the amount of the control signal that is applied to the broadband variable gain element relative to the amount of the control signal that is applied to the high frequency variable gain element.

15. The device of claim 12 and further including means for altering the amount of the control signal that is applied to the broadband variable gain element relative to the amount of the control signal that is applied to the high frequency variable gain element.

16. The device of claim 13 and further including means for altering the amount of the control signal that is applied to the broad band variable gain element relative to the amount of the control signal that is applied to the high frequency variable gain element.

* * * * *